United States Patent [19]

Takano

[11] Patent Number: 4,921,833

[45] Date of Patent: May 1, 1990

[54] SUPERCONDUCTING MEMBER

[75] Inventor: Satoshi Takano, Osaka, Japan

[73] Assignee: Sumitomo Electric Industries, Ltd., Osaka, Japan

[21] Appl. No.: 198,261

[22] Filed: May 25, 1988

[30] Foreign Application Priority Data

May 26, 1987 [JP] Japan ................. 62-128587

[51] Int. Cl.$^5$ ............................................. B32B 3/02
[52] U.S. Cl. ............................ 505/1; 505/701; 505/702; 505/704; 428/432; 428/457; 428/469; 428/688; 428/930; 29/599
[58] Field of Search ............ 505/1, 701, 702, 704; 428/688, 930, 432, 457, 469; 29/599

[56] References Cited

FOREIGN PATENT DOCUMENTS 0284489 3/1987 European Pat. Off. .

OTHER PUBLICATIONS

Epitaxial Ordering of Oxide SC Thin Film on (100) SrTiO3 . . . Wu et al, Bell Research, Jul. 27, 1987.

Primary Examiner—Patrick Ryan
Attorney, Agent, or Firm—Pennie & Edmonds

[57] ABSTRACT

A superconducting member comprising a first film including least a single ceramic layer formed on the surface of a substrate of an arbitrary base material. A film of an oxide superconductor is formed on the first film. In a useful embodiment, the substrate is stainless steel, and the first ceramic layer by zirconium oxide. This superconducting member can be formed as a superconducting tape, a superconducting wire or the like.

16 Claims, 1 Drawing Sheet

SUPERCONDUCTING MEMBER

BACKGROUND OF THE INVENTION

1. Field of the Invention

The present invention relates to the structure of a superconducting member, and more particularly, it relates to the structure of a superconducting member having excellent superconductivity, which is unrestrictedly formed on a substrate of an arbitrary base material.

2. Description of the Prior Art

In recent years, oxide superconducting materials having perovskite structure, such as those of La-Sr-Cu-O and Y-Ba-Cu-O, have been discovered in succession. Since such discovery, many studies have been made on these materials, which are higher in critical temperature than conventional superconducting materials such as alloys or intermetallic compounds of Nb-Ti, Nb-Ge and the like.

Such oxide superconducting materials are typically manufactured by powder sintering at present. For example, a superconducting wire rod is provided by filling powder of an oxide superconducting material in a metal pipe and performing wire drawing. In order to form a circuit, there has been proposed a method of kneading powder of an oxide superconducting material with an organic binder and printing the same. In either method, the powder is shaped into a linear or layer member, to be finally sintered. Thus, the powder member is inevitably shrunk in sintering, and hence it is difficult to obtain a final product of arbitrary configuration or size.

Every oxide superconductor heretofore discovered has high crystal anisotropy, and it is necessary to orient its crystal structure in order to obtain high critical current density. However, it is difficult to provide accurate orientation by sintering. Further, voids inevitably occur upon sintering, and hence it has been impossible to obtain an oxide superconductor having satisfactory critical current density by sintering.

On the other hand, an oxide superconductor having an arbitrary configuration can be easily obtained by preparing a base material with excellent workability depositing a superconducting film on the same, in a manner unlike the sintering process. In particular, such a superconducting film can be made by a vapor phase film process such as sputtering, which is excellent in crystal controllability, to easily obtain a dense film, as effective means for obtaining a superconductor having excellent properties.

In the case of forming a thin film on the base material, however, heating in an oxidizing atmosphere is required for performing heat treatment after film formation or for heating the substrate during film formation. Thus, the superconductivity tends to be reduced by oxidation of the base material or diffusion between a superconducting layer and the base material. In the method of forming a thin film on the base material, therefore, the base material is restricted to a high-priced material which is hard to work, such as $SrTiO_3$ or MgO.

In particular, formation of an oxide superconducting film on a metal base material has not yet been studied since the base material is extremely oxidized and remarkable influence is exerted by diffusion between the superconducting layer and the base material. However, if a superconducting material is to be applied to an elongated member such as a tape, for example, it is preferable to employ a highly flexible metal substrate as a base material. Thus, the art requires a technique for forming an oxide superconducting layer on a substrate of an arbitrary base material.

SUMMARY OF THE INVENTION

An object of the present invention is to provide a superconducting member having excellent superconductivity which can be formed on a substrate of an arbitrary base material.

A superconducting member in accordance with the present invention comprises a first film including at least a single ceramic layer formed on the major surface of a base material and a second film containing an oxide superconductor formed on the first film.

The base of the substrate material may consist of a metal, a semiconductor or a ceramic material. The base material may contain a metal such as stainless steel. The ceramic layer forming the first film provided on the major surface of the base material may contain an oxide, such as zirconium oxide or strontium titanate.

The first film formed on the major surface of the base material may include at least a single layer having uniaxial orientation. Such uniaxial orientation may be C-axis orientation. Further, the first film may be formed by physical vapor deposition or chemical vapor deposition.

The second film may be formed by physical vapor deposition. The oxide superconductor forming the second film preferably contains copper ions, and more preferably, the material is an oxygen deficiency type perovskite structure. A preferable example of such a material is a Y-Ba-Cu-O oxide superconductor.

According to the present invention, the base material serves as a support for a superconductor. Further, the base material is adapted to maintain the configuration and size of the superconductor, as well as to reinforce the superconductor. The base material further serves as a stabilizing material against heat and current, and hence the same preferably has high thermal and electrical conductivity. Although the base material is not particularly restricted in material, copper, copper alloy or stainless steel can be employed as a preferable metal material. Further, a semiconductor material can be prepared by silicon or the like, while a ceramic material can be prepared by alumina or the like, to provide the base material in accordance with the present invention.

The first film, preferably including a ceramic layer, provided on the base material is adapted to prevent oxidation of the base material as well as to prevent diffusion between the base material and the superconductor.

The term "ceramics" is generally defined as a nonmetal inorganic solid material. However, not all films containing nonmetal inorganic solid materials are suitable for practice of in the present invention. For example, water soluble salts are not satisfactory for use in connection with the present invention, since they may deteriorate upon exposure to moisture and may interfere with the performance of the superconducting member. However, most ceramic films are suitable for preventing oxidation of base materials, being prepared of metal and semiconductor materials, as well as to prevent diffusion between the base materials and superconductors. For example, alumina ($Al_2O_3$) is relatively reactive with oxide superconductors. However, an alumina film formed on a silicon substrate serves to improve the properties of a film of an oxide superconducting material formed on the alumina film, as hereinafter described with reference to preferred embodiments.

A ceramic material effective in the present invention can be selected from various materials such as oxides, nitrides, carbides and the like, while an oxide can be employed as the most preferable material in view of its stability in a high-temperature oxidizing atmosphere. A particularly effective ceramic material can be selected from strontium titanate ($SrTiO_3$), zirconium oxide ($ZrO_2$) and magnesium oxide (MgO). In the case of zirconium oxide, it is effective to employ stabilized zirconia containing 2 to 20 percent by weight of $Y_2O_3$ or CaO.

A film including a ceramic layer of such an oxide can be formed by a vapor phase film process such as vapor deposition, sputtering, chemical vapor deposition or the like. The oxide film can be formed by applying oxide powder, being kneaded with an organic binder, to the base material and firing the same. The film including the ceramic layer is not particularly restricted in thickness. In order to completely cover the surface of the base material and prevent diffusion, the thickness of the film including the ceramic layer may be at least 0.3 $\mu$m. If the base material has a smooth surface, the thickness of the film including the ceramic layer may be as little as 0.02 $\mu$m, while attaining satisfactory effects according to the present invention. The thickness of this film is preferably not more than 3 $\mu$m in cases where the final product needs to be flexible, since cracking is easily caused by bending if the thickness is increased. The ceramic layer may comprise a single layer having the aforementioned function, or a film having multilayer structure.

It is indispensable to control the orientation of oxide superconductors in order to increase crystal anisotropy and obtain high current density. According to the present invention, orientation of the first film including the ceramic layer, serving as a substrate for the second film containing the superconductor, is so controlled as to also control orientation of the film containing the superconductor. In the first film including the ceramic layer, relatively accurate orientation can be obtained depending on the orientation of the base material and the first film forming conditions. For example, a ceramic film formed on the surface of a substrate of copper can be made which will have excellent orientation, and a superconductor formed thereon will have high critical current density. If 80 percent by volume of the ceramic film is uniaxially oriented, particularly in the X-axis direction the orientation of a superconductor formed thereon is beneficially increased.

A film containing the superconductor according to the present invention is preferably manufactured by sputtering performed while heating the substrate to obtain the film containing the superconductor at a relatively low temperature, since the ceramic film is reactive under a high temperature. When a $ZrO_2$ film is employed as a substrate, the film containing the superconductor can be printed on the first film, followed by sintering.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
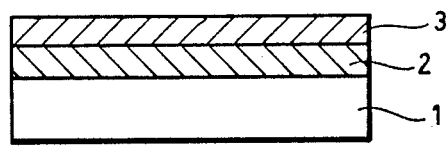
FIG. 1 is a sectional view showing a superconducting tape in accordance with an embodiment of the present invention.

FIG. 1 is a sectional view showing a superconducting tape in accordance with an embodiment of the present invention. Referring to FIG. 1, a metal tape 1 serving as a base material is first provided with a ceramic film 2. A film 3 of an oxide superconductor having perovskite structure is then deposited.

Figure 2:
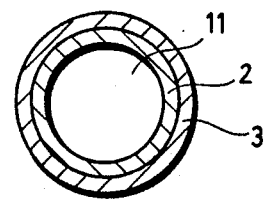
FIG. 2 is a sectional view showing a superconducting wire in accordance with another embodiment of the present invention.

FIG. 2 is a sectional view showing a superconducting wire in accordance with another embodiment of the present invention. Referring to FIG. 2, a metal wire 11 serving as a base material is provided on its outer peripheral surface with a ceramic film 2, over which is deposited a film 3 of an oxide superconductor having perovskite structure.

Description is now made of Examples of superconducting tapes provided in accordance with the present invention.

EXAMPLE 1

Samples of superconducting tapes in accordance with the present invention were prepared by tapes formed by parent materials of copper with Ti films 1 $\mu$m in thickness provided on the surfaces thereof (shown as "1 $\mu$mTi/Cu" in Table 1), tapes of SUS304 stainless steel and of Cu-Ni alloy, which were provided thereon with various ceramic films as listed in Table 1, by plasma CVD process or ion plating. Further, thin films of $Y_1Ba_2Cu_3O_x$ were formed on the tapes by sputtering. Sputtering was performed by: (1) by heating the substrate to a temperature of 800° C.; and (2) forming a film at ordinary temperatures and performing heat treatment in the atmosphere at a temperature of 950° C.

For the purpose of comparison, thin films of oxide superconductors similar to those of Example 1 were respectively formed on a tape of Cu and those of SUS304 stainless steel directly by sputtering.

Table 1 shows properties of superconducting tapes thus obtained.

TABLE 1

| | | tape material | tape thickness (mm) | material for ceramic thin film | thickness of ceramic film ($\mu$m) | thickness of $Y_1Ba_2Cu_3O_x$ film ($\mu$m) | sputtering method | $T_c$(°K.) | flexibility* |
|---|---|---|---|---|---|---|---|---|---|
| Example | 1 | 1 $\mu$mTi/Cu | 0.1 | $Al_2O_3$ | 1 | 0.5 | (1) | 65 | o |
| | 2 | 1 $\mu$mTi/Cu | 0.1 | MgO | 1 | 0.5 | (1) | 72 | o |
| | 3 | 1 $\mu$mTi/Cu | 0.1 | $ZrO_2$ | 0.3 | 1 | (1) | 90 | o |
| | 4 | 1 $\mu$mTi/Cu | 0.1 | $ZrO_2$ | 2 | 1 | (1) | 88 | o |
| | 5 | SUS304 | 0.2 | $ZrO_2$ | 1 | 1 | (2) | 87 | o |
| | 6 | SUS304 | 0.2 | $TiO_2$ | 1 | 1 | (2) | 82 | o |
| | 7 | SUS304 | 0.2 | $SrTiO_3$ | 1 | 1 | (2) | 92 | o |
| | 8 | Cu—Ni | 0.25 | TiN | 1 | 2 | (1) | 51 | o |

TABLE 1-continued

| | | tape material | tape thickness (mm) | material for ceramic thin film | thickness of ceramic film (μm) | thickness of $Y_1Ba_2Cu_3O_x$ film (μm) | sputtering method | $T_C$(°K.) | flexibility* |
|---|---|---|---|---|---|---|---|---|---|
| Reference Example | 1 | Cu | 0.1 | | | 3 | (1) | non-super-conductive | — |
| | 2 | SUS304 | 0.2 | | | 3 | (1) | non-super-conductive | — |
| | 3 | SUS304 | 0.2 | | | 3 | (1) | non-super-conductive | — |
| | 4 | SUS304 | 0.2 | | | 3 | (1) | 31 | non-super-conductive |

*wound on a rod of 10 mm in thickness and bent for measurement of zero resistance temperature $T_C$
°$T_C$ change less than 1 deg.

From Table 1 it can be seen that the outermost film of the superconductor had a high critical temperature while the superconducting tape was excellent in flexibility in each sample prepared in accordance with the present invention. One of the reference examples, comprising a film of oxide superconductor deposited directly on the surface of the metal substrate, superconducted at a low critical temperature $T_C$, while the remaining examples were non-superconductive.

EXAMPLE 2

An $SiO_2$ film was formed on a silicon substrate by a sol-gel method. First, water and hydrochloric acid were added to an ethanol solution of silicon tetraethoxide to prepare a sol by hydrolysis. Then the silicon substrate was dipped in this sol to form a sol film on the substrate. Thereafter the silicon substrate was heated to a temperature of 500° C. in the atmosphere, to cause gelation of the sol film. Such operation was repeated 10 times, to form an $SiO_2$ film of about 0.2 μm in thickness on the silicon substrate.

Samples were then prepared by forming an MgO film 0.2 μm in thickness and an $Al_2O_3$ film 0.2 μm in thickness on the silicon substrate provided with the $SiO_2$ film as above, by RF magnetron sputtering. Film forming conditions were as follows:
  target: MgO polycrystal or $Al_2O_3$ polycrystal 100 mm in diameter
  target-substrate distance: 50 mm
  sputtering gas: Ar gas containing 10 vol.% of $N_2$
  gas pressure: $1 \times 10^{-2}$ Torr.
  output: 75 W
  film forming time: 1.5 to 2 hours It was determined by X-ray diffraction that the MgO film thus formed had strong C-axis orientation of (001). It was also determined that the $Al_2O_3$ film as formed had no uniaxial orientation.

A $Y_1Ba_2Cu_3O_x$ film 1 μm in thickness was formed on the MgO and $Al_2O_3$ ceramics film, by the sputtering method (1) of Example 1. A film of the oxide superconductor thus obtained was subjected to measurement of zero resistance temperature $T_C$ and critical current density $J_C$.

The film of the oxide superconductor formed on the MgO film had a zero resistance temperature $T_C$ of 84 K and critical current density $J_C$ of 1000 A/cm² at the temperature of liquid nitrogen (77.3 K). On the other hand, the film of the oxide superconductor formed on the $Al_2O_3$ film had a zero resistance temperature $T_C$ of 61 K. A reference example, prepared by forming a film of an oxide superconductor directly on a silicon substrate that is, without formation of an intermediate ceramic film, exhibited no superconductivity at the temperature of liquid helium (4.2 K).

According to the present invention as hereinabove described, the base material is first worked into arbitrary configuration and size, a first ceramic coating is then formed on its surface, and a film of an oxide superconductor is further formed on the same. This results in a superconducting member having excellent properties, formed on a substrate which may be of any desired material.

Further, the present invention can be employed in connection with a package for a semiconductor element formed on a ceramic substrate, as well as directly to a semiconductor element or to a sensor with a semiconductor substrate, to attain a very useful product. It is difficult to form an oxide superconducting layer directly on a metallic base material. Thus, a principal advantage of the present invention is that it permits a product such as a flexible metal material as the substrate and an oxide ceramic as the superconductor to be formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A superconducting member comprising:
   a substrate of a base material having a major surface;
   a first film, including at least a single layer between 0.02 μm and 2 μm thick of a ceramic material which is non-water-soluble and which does not absorb water, formed on said major surface of said substrate; and
   a second film containing an oxide superconductor formed on said first film.

2. A superconducting member in accordance with claim 1, wherein said base material is a metal.

3. A superconducting member in accordance with claim 1, wherein said base material is a semiconductor.

4. A superconducting member in accordance with claim 1, wherein said base material is a ceramics.

5. A superconducting member in accordance with claim 2, wherein said base material is stainless steel.

6. A superconducting member in accordance with claim 1, wherein said ceramic layer comprises a metal oxide.

7. A superconducting member in accordance with claim 6, wherein said metal oxide includes zirconium oxide.

8. A superconducting member in accordance with claim 6, wherein said metal oxide includes strontium titanate.

9. A superconducting member in accordance with claim 1, wherein said first film includes at least a single layer having uniaxial orientations.

10. A superconducting member in accordance with claim 9, wherein said uniaxial orientation includes C-axis orientation.

11. A superconducting member in accordance with claim 1, wherein said first film is formed by physical vapor deposition.

12. A superconducting member in accordance with claim 1, wherein said first film is formed by chemical vapor deposition.

13. A superconducting member in accordance with claim 1, wherein said second film is formed by physical vapor deposition.

14. A superconducting member in accordance with claim 1, wherein said oxide superconductor contains copper ions.

15. A superconducting member in accordance with claim 14, wherein said oxide superconductor has oxygen deficiency type perovskite structure.

16. A superconducting member in accordance with claim 15, wherein said oxide superconductor includes a Y-Ba-Cu-O oxide superconductor.

* * * * *